United States Patent
Kumakura

(10) Patent No.: US 8,159,383 B2
(45) Date of Patent: Apr. 17, 2012

(54) SWITCHED CAPACITOR CIRCUIT AND PIPELINED ANALOG-TO-DIGITAL CONVERSION CIRCUIT WITH THE SWITCHED CAPACITOR CIRCUIT

(75) Inventor: Yoshiaki Kumakura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 90 days.

(21) Appl. No.: 12/795,219

(22) Filed: Jun. 7, 2010

(65) Prior Publication Data

US 2010/0308870 A1    Dec. 9, 2010

(30) Foreign Application Priority Data

Jun. 8, 2009  (JP) ................ 2009-137525

(51) Int. Cl.
    *H03M 1/34*    (2006.01)
(52) U.S. Cl. ...................... 341/162; 341/161
(58) Field of Classification Search .......... 341/162, 341/161, 155, 172, 118, 120; 327/307, 554; 330/258, 9
    See application file for complete search history.

(56) References Cited

U.S. PATENT DOCUMENTS 6,806,745 B2 * 10/2004 Fujimoto ................ 327/94

FOREIGN PATENT DOCUMENTS

JP    2008-141396 A    6/2008

OTHER PUBLICATIONS

Mehdi Saberi, and Reza Lotfi, "A Capacitor Mismatch- and Nonlinearity-Insensitive 1.5- bit Residue Stage for Pipelined ADCs" p. 677-860, 2007 IEEE.

* cited by examiner

*Primary Examiner* — Joseph Lauture
(74) *Attorney, Agent, or Firm* — Arent Fox LLP

(57) ABSTRACT

A conversion circuit for converting a differential input signal into an output signal includes an amplifier that has an input terminal and an output terminal; a first capacitor in which, in a first period, a difference voltage of the differential input signal is applied across first and second terminals, and in a second period the first terminal is coupled to the output terminal of the amplifier and the second terminal is coupled to the input terminal of the amplifier; and a second capacitor in which, in the second period, a reference voltage in accordance with the differential input signal is applied to a first terminal, and the second terminal of the first capacitor is coupled to a second terminal of the second capacitor.

10 Claims, 13 Drawing Sheets

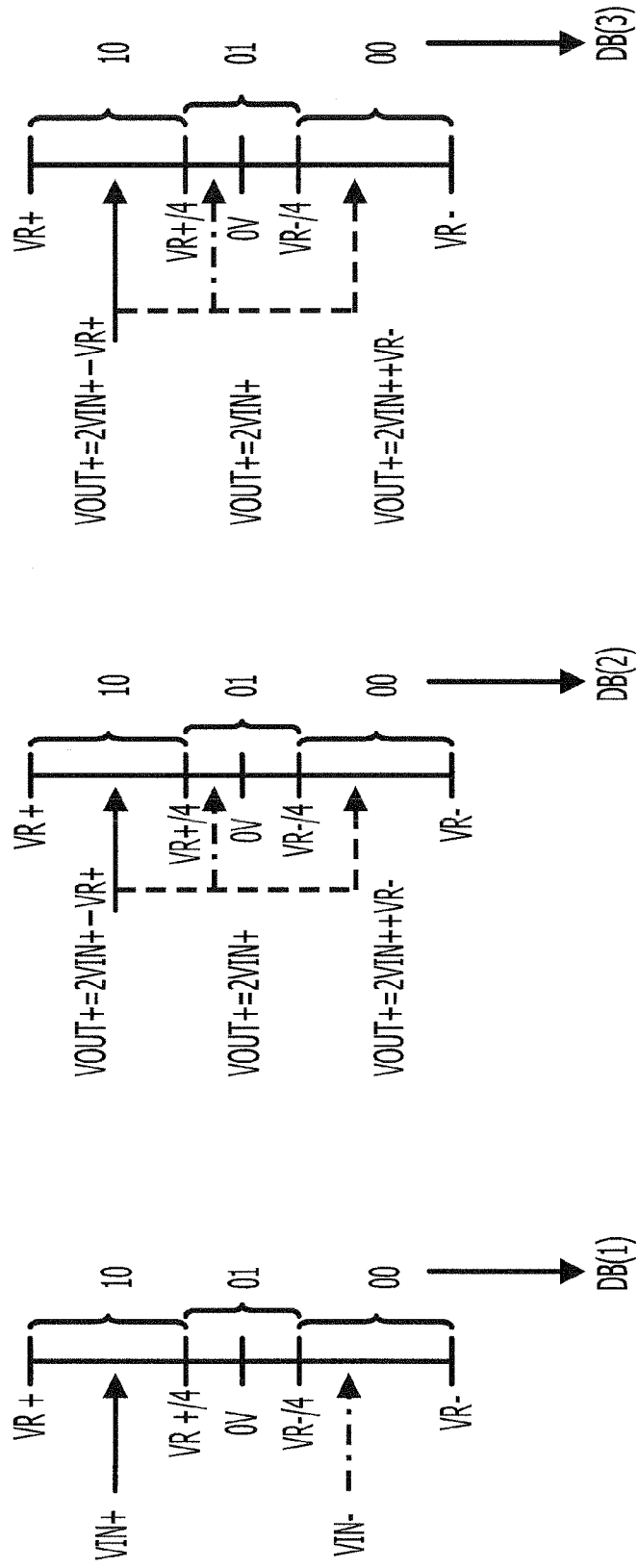

SWITCHED CAPACITOR CIRCUIT AND PIPELINED ANALOG-TO-DIGITAL CONVERSION CIRCUIT WITH THE SWITCHED CAPACITOR CIRCUIT

This application is based upon and claims the benefit of priority of the prior Japanese Patent Application No. 2009-137525, filed on Jun. 8, 2009, the entire contents of which are incorporated herein by reference.

FIELD

The embodiments discussed herein relate to a switched capacitor circuit and a pipelined analog-to-digital conversion circuit with the switched capacitor circuit.

BACKGROUND

A pipelined analog-to-digital (AD) conversion circuit includes unit conversion circuits in a plurality of stages and an encoder which encodes output digital codes from the unit conversion circuit at each stage to generate an output digital code. The unit conversion circuit includes a sub ADC which performs AD conversion of an analog input signal, and a switched capacitor circuit which amplifies the analog input signal and changes it in accordance with the AD conversion result. The pipelined AD conversion circuit controls unit conversion circuits in a plurality of stages to be in sample periods and hold periods sequentially from the first stage in a pipelined manner, thereby generating output digital codes with high accuracy.

The pipelined AD conversion circuit is described in, for example, Mehdi Saberi, and Reza Lotfi "A Capacitor Mismatch- and Nonlinearity-Insensitive 1.5-bit Residue Stage for Pipelined ADCs" pages 677-680, 2007 IEEE.

Japanese Laid-open Patent Publication No. 2008-141396 discloses a cyclic AD conversion circuit which uses a single comparator in a time-divisional manner.

A conventional switched capacitor circuit has two kinds of capacitors which are designed so that their capacitances are the same. The capacitances of the capacitors include relative errors caused by manufacturing variations. The relative errors cause an error in a voltage of an output signal, leading to a reduction in conversion accuracy. Increasing the size of a capacitor to increase the capacitance enables the relative error in the capacitance of capacitors to be reduced. A large capacitance of a capacitor, however, gives rise to increases in the sample period and hold period of a switched capacitor circuit. As a result, in a pipelined AD conversion circuit, the conversion speed decreases, the power consumption increases, and the exclusive area used on a chip increases. In other words, there is a trade-off relationship between the relative error and the conversion speed, power consumption and the exclusively occupied area in regard to the capacitance of a capacitor.

SUMMARY

According to an aspect of the embodiments, a conversion circuit for converting a differential input signal into an output signal includes an amplifier that has an input terminal and an output terminal; a first capacitor in which, in a first period, a difference voltage of the differential input signal is applied across first and second terminals, and in a second period, the first terminal is coupled to the output terminal of the amplifier and the second terminal is coupled to the input terminal of the amplifier; and a second capacitor in which, in the second period, a reference voltage in accordance with the differential input signal is applied to a first terminal, and the second terminal of the first capacitor is coupled to a second terminal of the second capacitor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 3A, 3B and 3C illustrate the operation of the pipelined ADC of FIG. 1;

DESCRIPTION OF THE EMBODIMENTS

Figure 1:
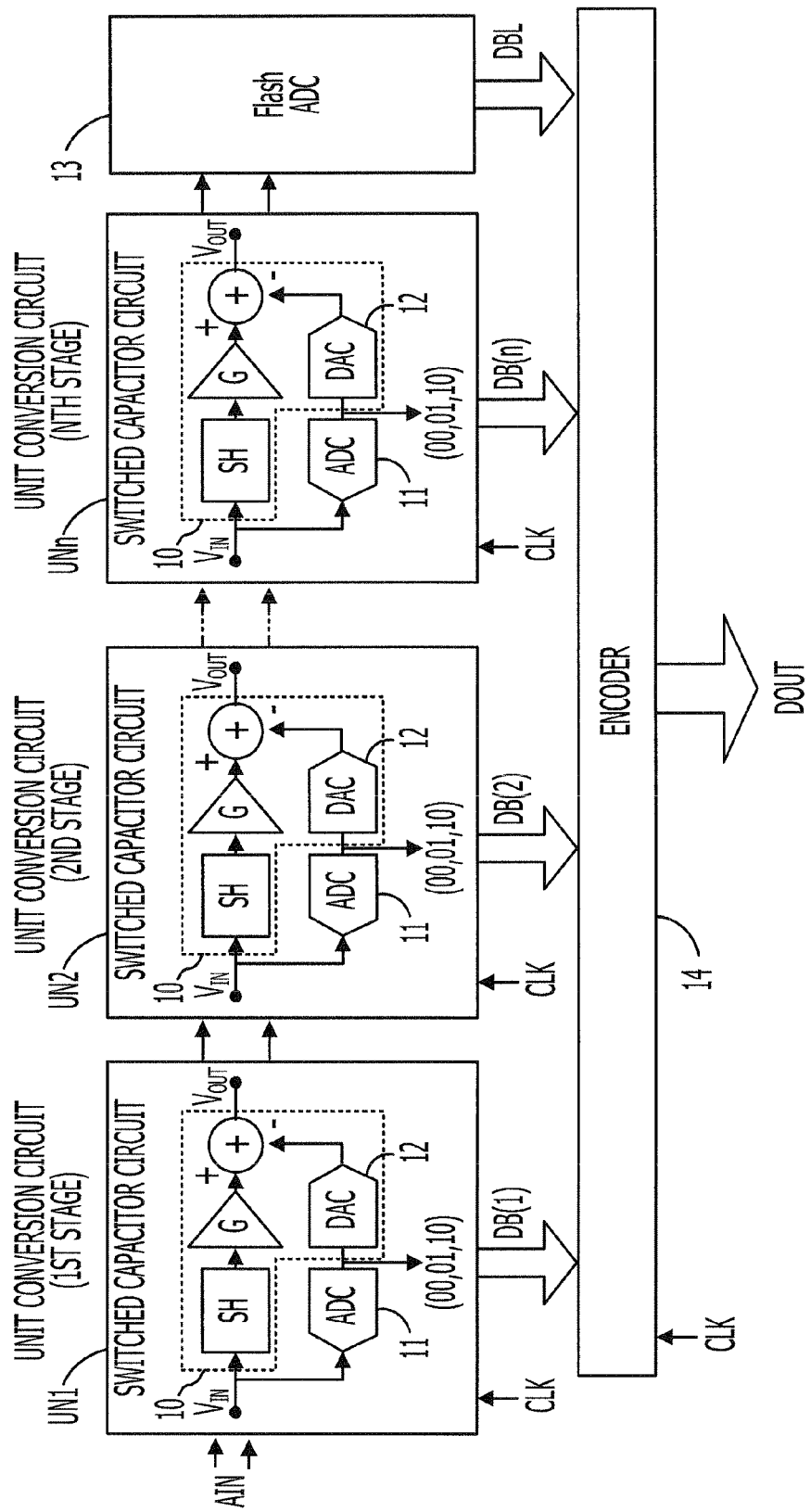
FIG. 1 illustrates a pipelined analog-to-digital converter (ADC) in the present embodiment.

FIG. 1 is a configuration diagram of a pipelined analog-to-digitalconverter (ADC) in the present embodiment. The pipelined ADC includes unit conversion circuits UN1 to UNn, which are coupled in multiple stages, for detecting bits in order of decreasing significance from an analog input signal AIN and generating sub-digital signals DB(1) to DB(n), respectively; a flash ADC 13 which converts an output VOUT of the unit conversion circuit UNn at the final stage into a least significant bit (LSB) sub-digital signal DBL, and an encoder 14 which encodes sub-digital signals DB generated by the unit conversion circuits UN1 to UNn and the flash ADC 13, using a given operational expression, to generate a digital output code DOUT.

The unit conversion circuits UN1 to UNn each include a 1.5-bit ADC 11 which converts an analog input signal VIN into a 1.5-bit sub-digital signal DB, and a switched capacitor circuit 10. The switched capacitor circuit 10 samples and holds the analog input signal VIN, amplifies it, for example, by a factor of two, adds or subtracts a reference voltage generated by the 1.5-bit ADC 11, and outputs an analog output signal VOUT. A 1.5-bit digital-to-analog converter (DAC) 12 generates one of reference voltages VR+, 0 V, and VR− in accordance with the 1.5-bit sub-digital signal DB.

Criteria voltages VR+ and VR− are respectively the upper limit (positive) and the lower limit (negative) of the differential signals VIN+ and VIN− of the analog input signal VIN. Accordingly, the resultant amplitude of the differential analog input signals VIN+ and VIN− is within the range from 2*VR+ to 2*VR−.

In the unit conversion circuits UN1 to UNn coupled in multiple stages, a first period, or a sample period, and a second period, or a hold period, are alternately repeated in synchronization with a clock CLK. The analog input signal AIN is input as the input voltage VIN to the unit conversion circuit UN1 at a first stage, and the unit conversion circuit UN1 converts the input voltage VIN into a sub-digital signal DB (hereinafter referred to as a "digital signal DB") of the most significant bit (MSB).

Analog input voltages VIN+ and VIN− are, for example, differential analog voltages VIN+ and VI− each of which has an amplitude in the voltage range between the criteria voltages, from VR− to VR+. The 1.5-bit ADC 11 has a pair of comparators (not illustrated) which compare, for example, the analog input voltages VIN+ and VIN− with different criteria voltages VR+/4 and VR−/4 to determine which is the range of the analog input voltage VIN+ or VIN− among a voltage range from VR+ to VR+/4, a voltage range from VR+/4 to VR−/4, and a voltage range from VR−/4 to VR−. The 1.5-bit ADC 11 outputs one of 00, 01, and 10 as the digital signal DB in accordance with the detection result of the two comparators.

For example, in the case where the analog input voltage VIN+ is in the voltage range from VR+ to VR+/4, the digital signal DB of 10 is generated. In the case of the voltage range from VR+/4 to VR−/4, the digital signal DB of 01 is generated. In the case of the voltage range from VR−/4 to VR−, the digital signal DB of 00 is generated. Regarding the analog input voltage VIN− whose phase is opposite to that of the analog input voltage VIN+, the digital signal DB of 00 is generated in the case of the voltage range from VR+ to VR+/4, the digital signal DB of 01 is generated in the case of the voltage range from VR+/4 to VR−/4, and the digital signal DB of 10 is generated in the case of the voltage range from VR−/4 to VR−.

Figure 2A:
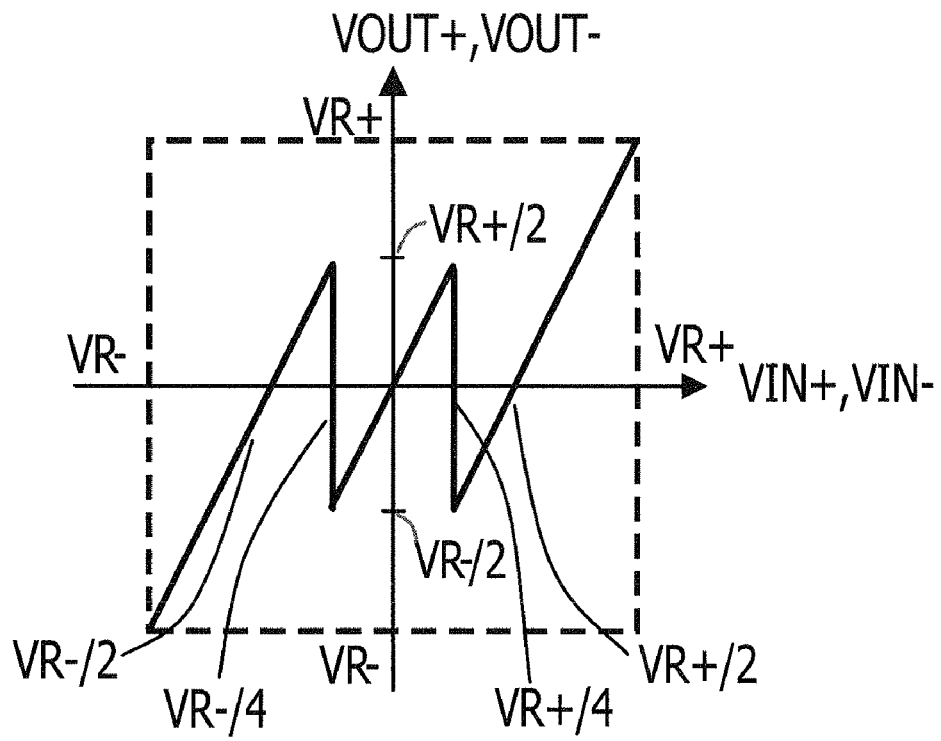
FIGS. 2A and 2B illustrate input and output characteristics of a switched capacitor circuit of FIG. 1.

FIG. 2A is a graph illustrating input and output characteristics of the switched capacitor circuit of FIG. 1. The switched capacitor circuit 10 has an operational amplifier G to amplify sampled analog input signals VIN+ and VIN− by a factor of, for example, two. Then, in accordance with the conversion result of the sub ADC 11, the switched capacitor circuit 10 outputs one of a voltage 2VIN+−VR+ obtained by subtracting the voltage VR+ from the voltage 2VIN+ amplified by the factor of two, the voltage 2VIN+ amplified by the factor of two, and a voltage 2VIN+−VR− obtained by subtracting the voltage VR− from the voltage 2VIN+ amplified by the factor of two, as an output voltage VOUT+. For an input voltage VIN− and an output voltage VOUT− which are opposite in phase to the input voltage VIN+ and the output voltage VOUT+, the switched capacitor circuit 10 operates in a similar way as described above.

As illustrated in the graph of input and output characteristics of FIG. 2A, an output voltage VOUT+=2VIN+−VR+ is generated in the case of the analog input voltage VIN+ in the range from VR+ to VR+/4, the output voltage VOUT+= 2VIN+ is generated in the case of the analog input voltage VIN+ in the range from VR+/4 to VR−/4, and the output voltage VOUT+=2VIN+−VR− is generated in the case of the analog input voltage VIN+ in the range from VR−/4 to VR−.

Figure 2B:
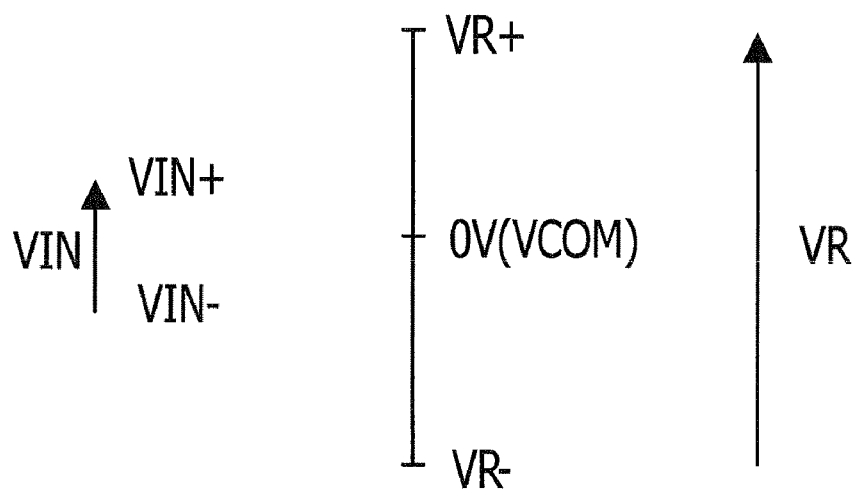

The amplitudes of the differential signals illustrated in FIG. 2B are as follows: VIN=VIN+−VIN−VR=VR+−VR− VOUT=VOUT+−VOUT−.

FIGS. 3A to 3C illustrate the operation of the pipelined ADC of FIG. 1. In FIGS. 3A to 3C, the operation of the ADC at three stages is illustrated. At the first stage UN1, it is detected which is the range of the analog input voltage VIN (VIN+, VIN−) among the voltage range from VR+ to VR+/4, the voltage range from VR+/4 to VR−/4, and the voltage range from VR−/4 to VR−. In other words, according to the usual operating principle of the ADC, whether the digital signal is 1 or 0 is determined depending on whether the analog input voltage VIN is higher than or lower than the center voltage value (VR++VR−)/2=0V in the input voltage range from VR+ to VR−. However, there is a possibility of causing errors in cases where the analog input voltage VIN is in the vicinity of the center value 0 V. Accordingly, in cases where the analog input voltage VIN is in the voltage range from VR+/4 to VR−/4, determination is made again in the next, lower-order ADC in order to correct the error.

With reference to FIG. 3A and the input voltage VIN+ on the positive side as an example, if it is determined at the first stage UN1 that the analog input voltage VIN+ is in the voltage range from VR+ to VR+/4, the switched capacitor circuit 10 outputs VOUT+=2VIN+−VR+. At this point, the most significant digital signal DB(1) is DB(1)=10. The VOUT+= 2VIN+−VR+ is an analog input of the unit conversion circuit UN2 of FIG. 3B at the next stage, and determination is made again as to which of three voltage ranges is the range of analog input. With reference to FIG. 3B, also in the second-stage unit conversion circuit UN2, it is determined that the analog input voltage VIN is in the voltage range from VR+ to VR+/4, and the switched capacitor circuit 10 outputs VOUT+= 2VIN+− VR+. Determination is made in a similar way in the unit conversion circuit UN3 at the third stage as illustrated in FIG. 3C.

If it is determined that each analog input VIN+ is in the voltage range from VR+/4 to VR−/4, the switched capacitor circuit 10 outputs VOUT+=2VIN+. If it is determined that each analog input VIN+ is in the voltage range from VR−/4 to VR−, the switched capacitor circuit 10 outputs VOUT+= 2VIN+−VR−. Then, AD conversion of the analog output voltage VOUT+, in which the voltage has been amplified by a factor of two in every case, is performed again at the next stage.

In the case of the input voltage VIN− on the negative side, the polarity (+, −) of each voltage of the above description is reversed.

The encoder 14 performs an operation for correcting an error on the basis of the digital signals DB obtained at individual stages.

Figure 4:
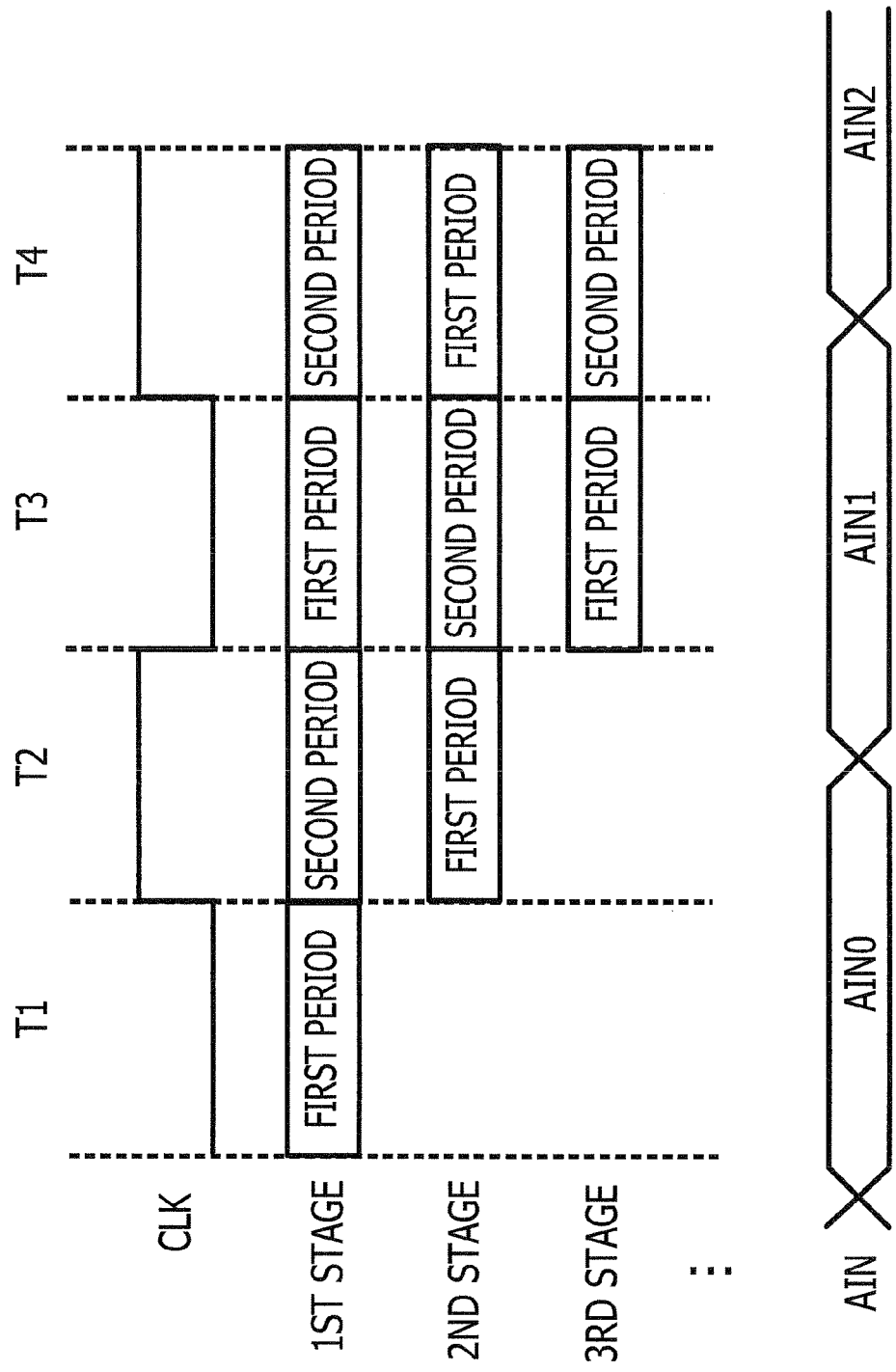
FIG. 4 illustrates a timing chart representing the operation of the pipelined ADC of FIG. 1.

FIG. 4 is a timing chart illustrating the operation of the pipelined ADC of FIG. 1. In order to perform AD conversion of the analog input signal AIN, the unit conversion circuits UN1 to UNn at individual stages alternately repeat the first period (sample period) and the second period (hold period) in synchronization with the clock CLK so that the unit conversion circuits at individual stages generate bits sequentially from the MSB to the LSB using the pipeline operation.

As illustrated in FIG. 4, at a time T1, the unit conversion circuit at the first stage is in the first period, and samples an analog input signal AIN0. At a time T2, the unit conversion circuit at the first-stage is in the second period, and the unit conversion circuit at the second stage is in the first period. That is, at the time T2, the unit conversion circuit UN1 at the first stage outputs an output voltage VOUT in the second period, and the unit conversion circuit UN2 at the second stage samples the output voltage VOUT as the input voltage VIN.

Likewise, at a time T3, the unit conversion circuit at the first stage is controlled to be in the state of the first period in which the next analog input signal AIN1 is sampled, and the unit conversion circuits at the second and third stages are controlled to be in the states of the second and first periods, respectively. At a time T4, the unit conversion circuits at the first and third stages are controlled to be in the state of the second period, and the unit conversion circuit at the second stage is controlled to be in the state of the first period. In other words, the unit conversion circuits at odd-numbered stages and the unit conversion circuits at even-numbered stages are controlled alternately to be in the state of the first period and the state of the second period. In the end, at a time Tn, the unit conversion circuit UNn at an nth stage outputs the digital signal DB(n) and the flash ADC 13 simultaneously outputs the LSB digital signal DBL, and then the encoder 14 performs an operation of the digital signals DB to generate the digital output code DOUT.

Figure 5:
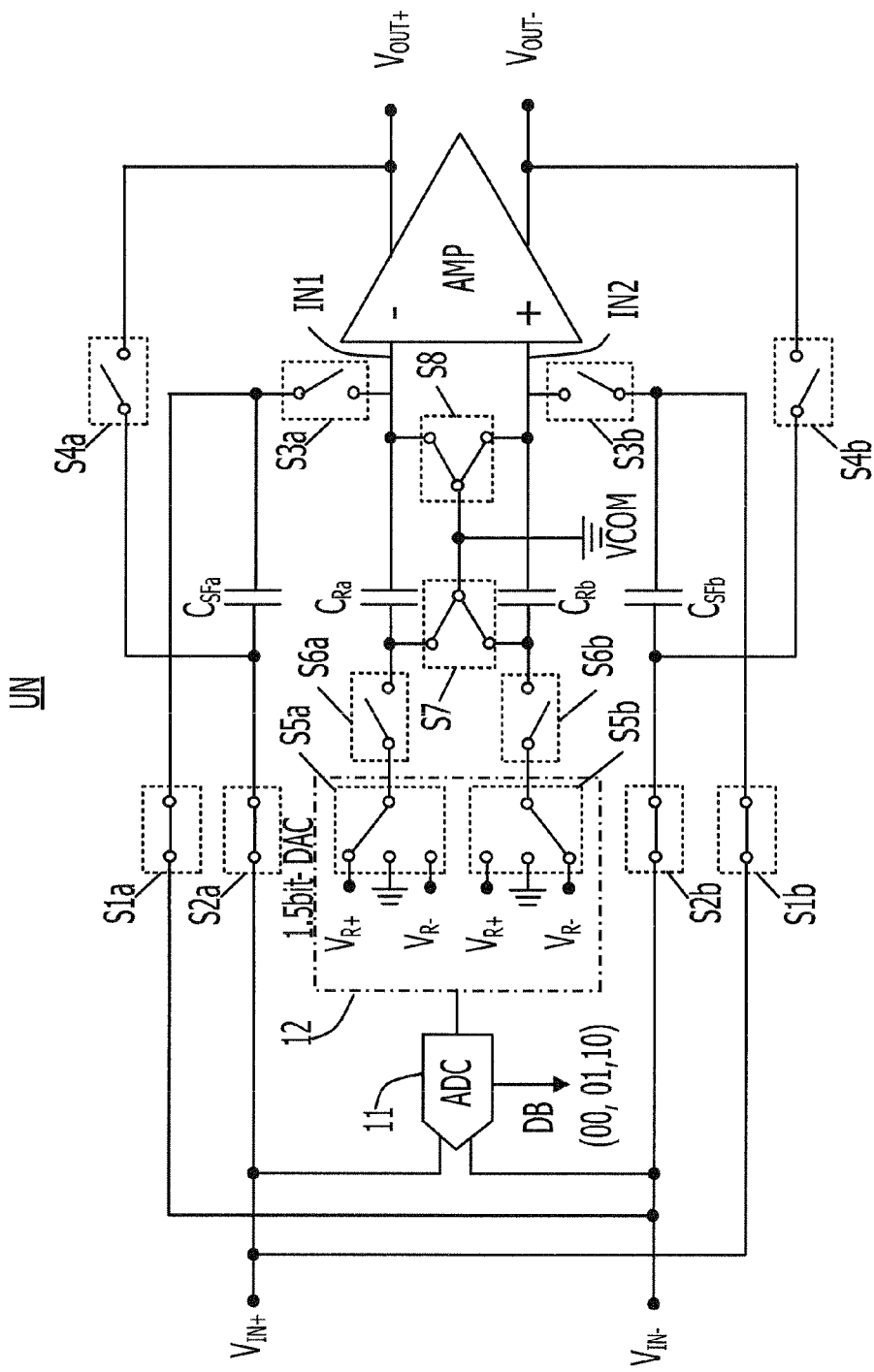
FIG. 5 illustrates a unit conversion circuit in the present embodiment of FIG. 1.
Figure 6:
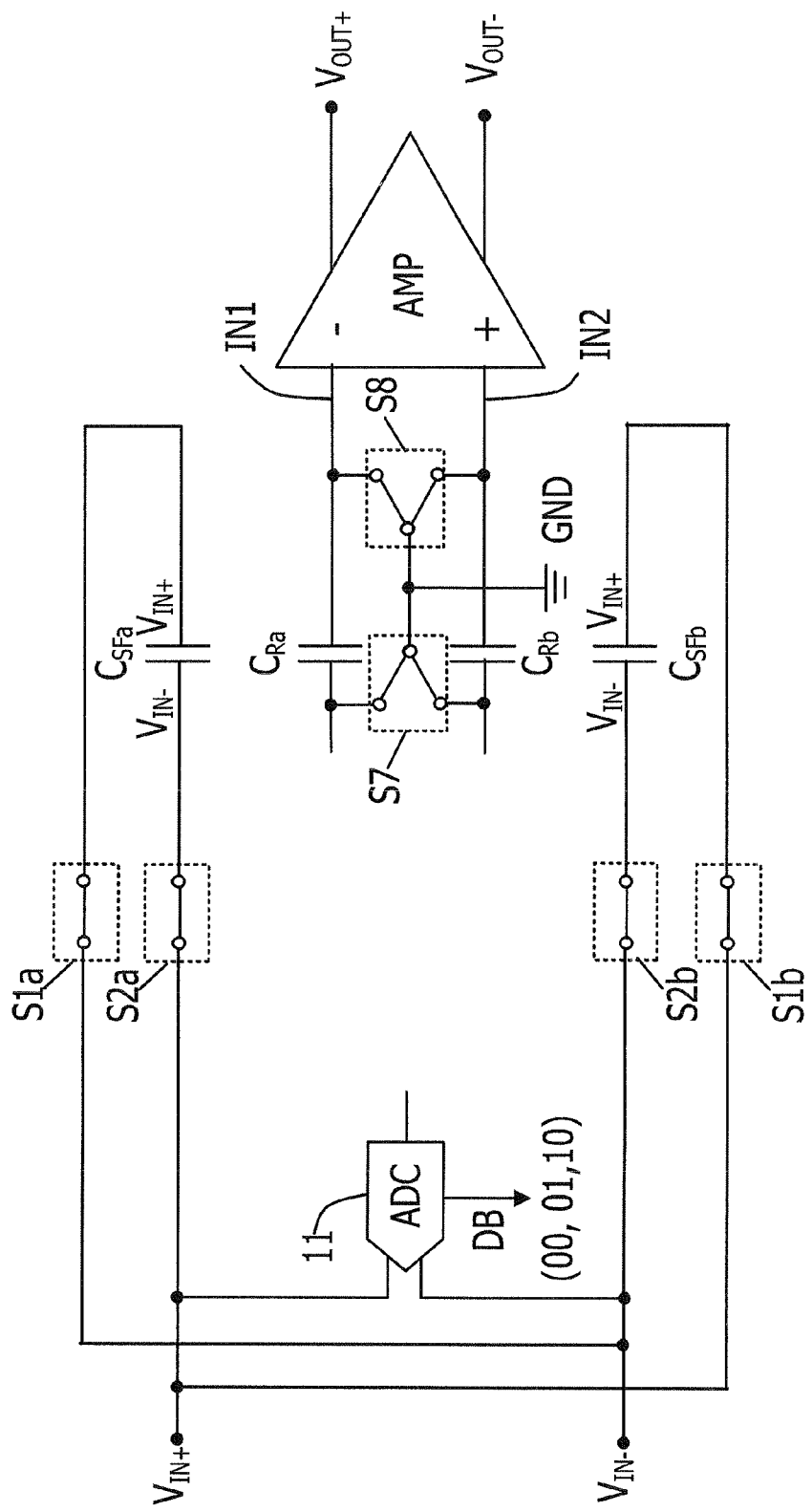
FIG. 6 illustrates a coupling state in a first period of the unit conversion circuit of FIG. 5.
Figure 7:
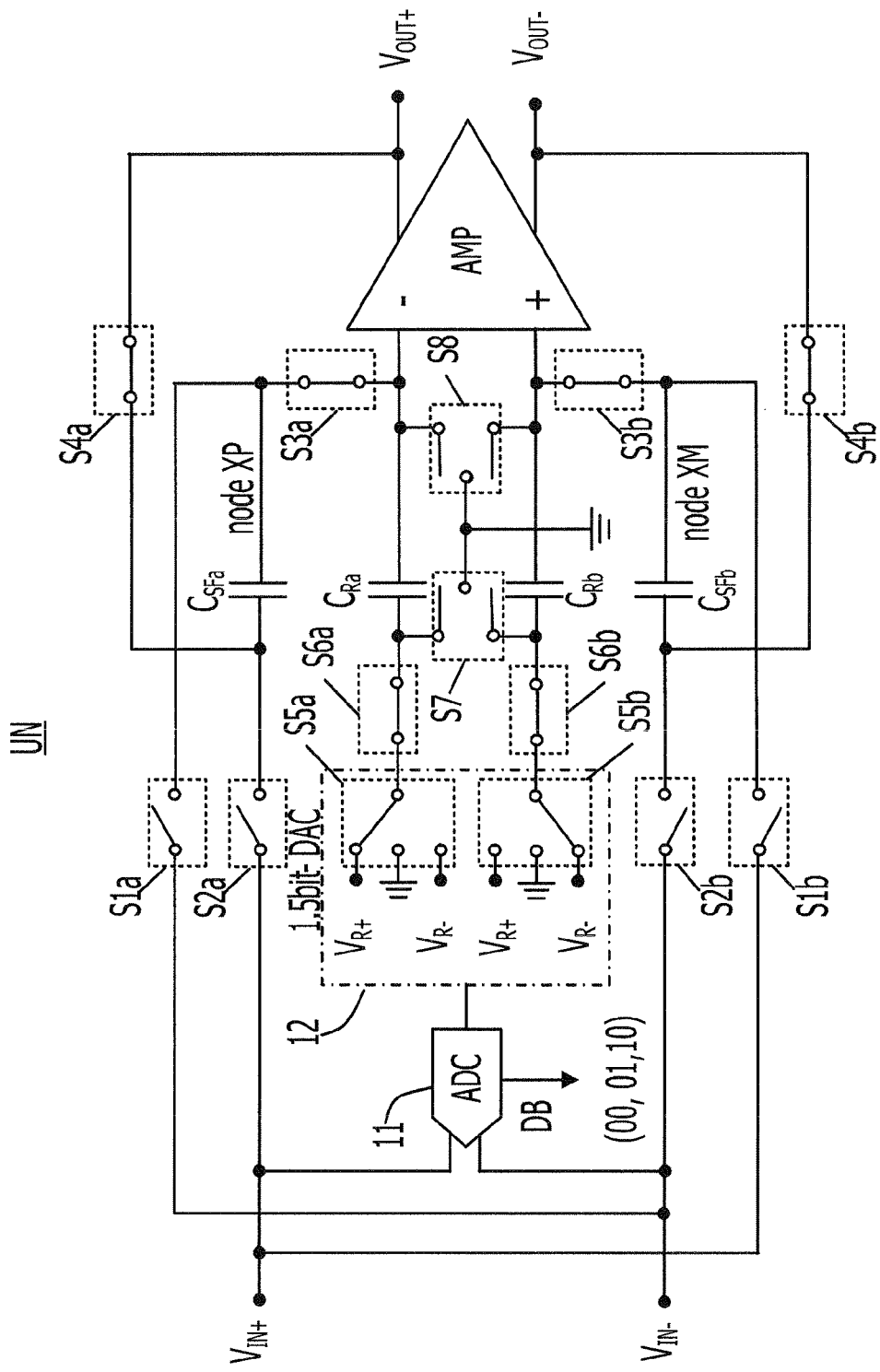
FIG. 7 illustrates the unit conversion circuit in the present embodiment.
Figure 8:
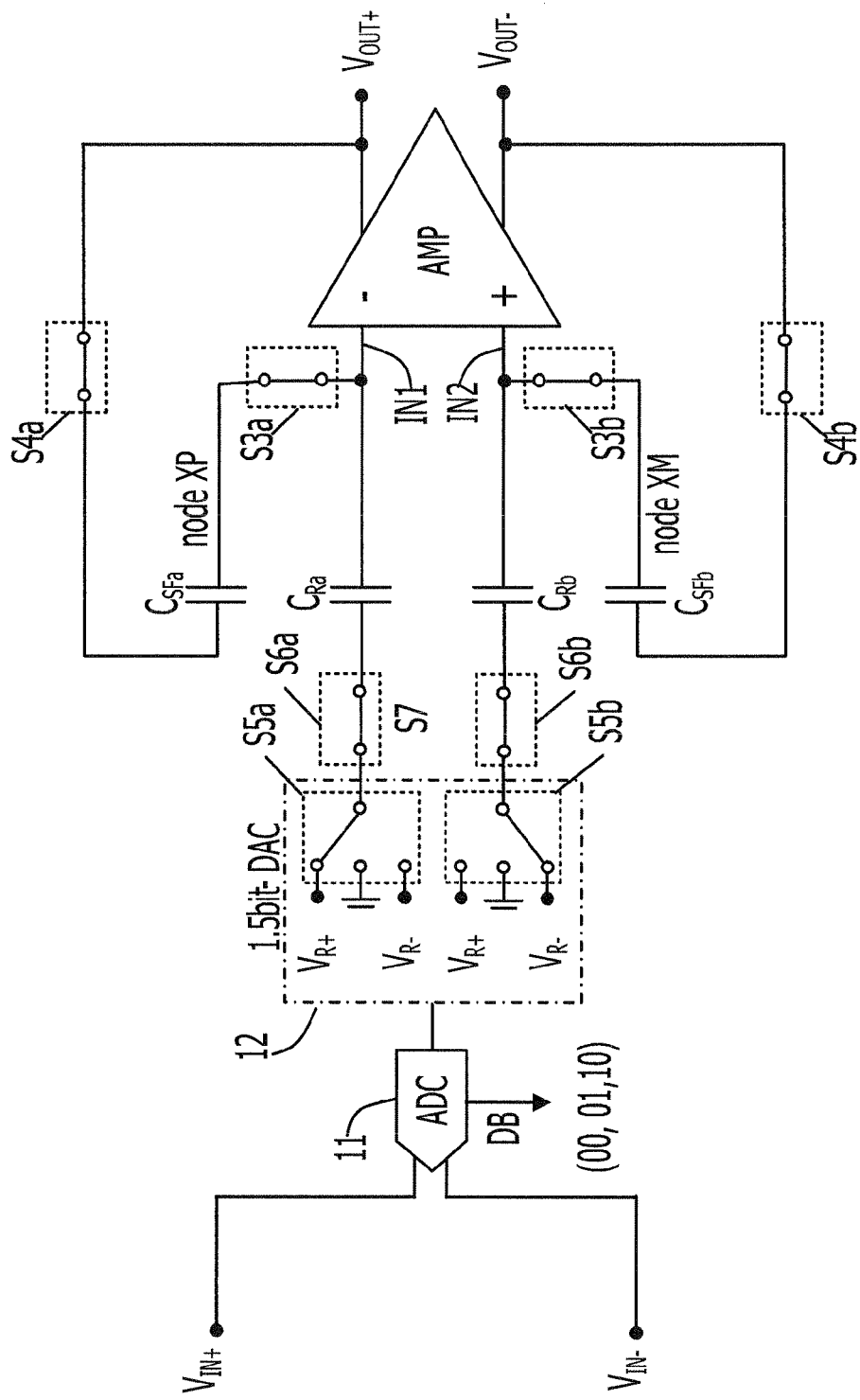
FIG. 8 illustrates a coupling state in a second period of the unit conversion circuit of FIG. 7.

FIGS. 5 and 7 are circuit diagrams of a unit conversion circuit in the present embodiment of FIG. 1. FIG. 5 illustrates a coupling state of the first period or a sample period, and FIG. 7 illustrates a coupling state of the second period or a hold period. FIG. 6 is a circuit diagram illustrating the coupling state of the first period of FIG. 5, and FIG. 8 is a circuit diagram illustrating the coupling state of the second period of FIG. 7.

As illustrated in FIG. 5, the unit conversion circuit is of a fully differential type, in which both an input and an output are differential signals. Analog differential input voltages VIN+ and VIN− are input to the unit conversion circuit UN, and the unit conversion circuit UN generates a 1.5-bit digital signal DB. The differential input voltages VIN+ and VIN− are differential voltages which have the similar amplitude centered at a common voltage VCOM=0V. In accordance with the digital signal DB generated by the ADC 11, the 1.5-bit digital-to-analog converter (DAC) 12 generates one of VR+, 0 V, and VR− as a reference voltage using switches S5$a$ and S5$b$. The value 0 V is the center value (VR++VR−)/2 of the reference voltages VR+ and VR−.

The unit conversion circuit UN further includes an operational amplifier AMP, first positive-side and negative-side capacitors CSFa and CSFb and second positive-side and negative-side capacitors CRa and CRb, and also includes a group of switches S1$a$, S1$b$, S2$a$, S2$b$, S3$a$, S3$b$, S4$a$, S4$b$, S6$a$, S6$b$, S7, and S8. The operational amplifier AMP generates two analog differential output voltages VOUT+ and VOUT− in accordance with a difference voltage of two inputs IN1 and IN2, and drives output using feedback coupling to be described later so that voltages of the inputs IN1 and IN2 become equal.

All of a group of capacitors CSFa, CSFb, CRa, and CRb are designed to have the similar capacitance, and therefore they have capacitances which are equal in the range including variation errors. The group of switches, the group of capacitors, the operational amplifier AMP, etc. make up the switched capacitor circuit 10 illustrated in FIG. 1.

As illustrated in FIG. 5, the group of switches is controlled to be in the state of the first period. In the first period state, among switches illustrated on the upper side, the switches S1$a$ and S2$a$ are turned on, and the switches S3$a$ and S6$a$ are turned off. Among switches illustrated on the lower side, the switches S1$b$ and S2$b$ are turned on, and the switches S3$b$ and S6$b$ are turned off. The switches S7 and S8 each couple the two inputs IN1 and IN2 of the operational amplifier to ground 0 V, or the common voltage VCOM, to short-circuit the capacitors CRa and CRb.

FIG. 6, which is similar to FIG. 5, illustrates a capacitor in the conductive state, a group of capacitors, the operational amplifier AMP, etc. The switches S1$a$ and S2$a$ are turned on to couple the differential input voltages VIN+ and VIN− to two terminals of the first positive-side capacitor CSFa so that the difference voltage is applied. Likewise, the switches S1$b$ and S2$b$ are turned on to couple the differential input voltages VIN− and VIN+ to two terminals of the first negative-side capacitor CSFb so that the difference voltage is applied. The charge amounts QSFa and QSFb accumulated in the capacitors CSFa and CSFb are expressed by equations (1) and (2). Note that VIN+ and VIN− represent the positive value and the negative value of a differential input voltage, respectively, and their absolute values are equal, and therefore VIN+−VIN−=2*VIN+, VIN−−VIN+=2*VIN−.

$$QSFa = CSFa*(VIN+ - VIN-) = 2*CSFa*VIN+ \quad (1)$$

$$QSFb = CSFb*(VIN- - VIN+) = 2*CSFb*VIN- \quad (2)$$

In this first period, the 1.5-bit ADC 11 in the stage performs the foregoing ADC of the input differential voltages VIN+ and VIN−.

The two inputs IN1 and IN2 of the operational amplifier AMP are both coupled to ground GND (0 V), or the common voltage VCOM, and the capacitors CRa and CRb are short-circuited to ground GND.

Next, as illustrated in FIG. 7, the group of switches is controlled so that they are in the state of the second period. In the state of the second period, among switches illustrated on the upper side, the switches S3$a$, S4$a$ and S6$a$ are turned on, and the switches S1$a$ and S2$a$ are turned off. Among switches illustrated on the lower side, the switches S3$b$, S4$b$ and S6$b$ are turned on, and the switches S1$b$ and S2$b$ are turned off. The switches S7 and S8 are turned off.

The switches S5$a$ and S5$b$ of the 1.5-bit DAC 12 each become coupled to one of the reference voltages VR+, 0 V, and VR− in accordance with the digital code DB of the 1.5-bit ADC 11. In the example illustrated in FIG. 7, the positive-side input voltage VIN+ of a differential analog input voltage is in the range from VR+ to VR+/4, and the switch S5$a$ is coupled to the reference voltage VR+. The negative-side input voltage VIN− is in the range from VR−/4 to VR−, and the switch S5$b$ is coupled to the reference voltage VR−.

FIG. 8, which is similar to FIG. 7, illustrates a capacitor in the conductive state, a group of capacitors, the operational amplifier AMP, etc. The first positive-side capacitor CSFa is coupled between the first input IN1 and the first output VOUT+ of the operational amplifier AMP, and the second positive-side capacitor CRa is coupled between the reference voltage VR+ and one terminal XP of the first positive-side capacitor CSFa. Likewise, the first negative-side capacitor CSFb is coupled between the second input IN2 of the operational amplifier AMP and the second output VOUT−, and the second negative-side capacitor CRb is coupled between the reference voltage VR− and one terminal XM of the first negative-side capacitor CSFb.

In the coupling state of the second period, feedback coupling is formed between the input and the output in the operational amplifier AMP, and the operation of the operational amplifier AMP which drives the output in accordance with the input voltage difference causes the inputs IN1 and IN2 to become ground 0 V, or the common voltage VCOM.

The ground voltage 0 V and the reference voltage VR+ are applied to the second capacitors CRa and CRb, and charge corresponding to the difference between the voltages is accumulated. Adversely, the nodes XP and XM of the first capacitors CSFa and CSFb are kept to the ground voltage 0 V or the common voltage, which is similar to in the first period, and therefore the amounts of charge of the nodes XP and XM in the second period are similar to those in the first period. Therefore, according to the law of conservation of charge at the nodes XP and XM, the following equations (3a) and (4a) hold.

$$2*CSFa*VIN+=QSFa+CRa*VR+ \quad (3a)$$

$$2*CSFb*VIN-=QSFb+CRb*VR- \quad (4a)$$

Transforming these equations gives the following equations:

$$QSFa=2*CSFa*VIN+-CRa*VR+ \quad (3)$$

$$QSFb=2*CSFb*VIN--CRb*VR- \quad (4)$$

Note that the amounts of charge of the first capacitors CSFa and CSFb in the second period are represented as QSFa and QSFb.

Equation (3) indicates that the second capacitor CRa is charged by applying the reference voltages VR+ and 0 V, and, at the node XP, the corresponding charge is removed from the first capacitor CSFa. That is, positive charge at the node XP of the first capacitor CSFa decreases. Likewise, equation (4) indicates that the second capacitor CRb is charged by applying the reference voltages VR- and 0 V, and, at the node XM, the corresponding charge is removed from the first capacitor CSFb. That is, negative charge at the node XM of the first capacitor CSFb decreases.

The two inputs IN1 and IN2 of the operational amplifier AMP are 0 V, and therefore its differential output signal voltages VOUT+ and VOUT- are driven to QSFa/CSFa and QSFb/CSFb. Accordingly, from equations (3) and (4), the differential output signal voltages VOUT+ and VOUT- of the switched capacitor circuit are expressed by the following equations (5) and (6).

$$VOUT+=QSFa/CSFa=2*VIN+CRa/CSFa*VR+ \quad (5)$$

$$VOUT-=QSFb/CSFb=2*VIN--CRb/CSFb*VR- \quad (6)$$

All of the capacitors CSFa, CSFb, CRa and CRb are designed to have the similar capacitance; however, relative errors caused by manufacturing variations are actually included. Assuming that relative errors of capacitances between CRa and CSFa and between CRb and CSFb are dCa and dCb, respectively, CSFa-CRa=dCa, that is, CRa=CSFa+dCa, and CSFb-CRb=dCb, that is, CRb=CSFb+dCb. When these expressions are substituted in equations (5) and (6), the differential output signal voltages VOUT+ and VOUT- are expressed by the following equations (7) and (8).

$$VOUT+=QSFa/CSFa=2*VIN+-(1+dCa/CSFa)*VR+ \quad (7)$$

$$VOUT-=QSFb/CSFb=2*VIN--(1+dCb/CSFb)*VR- \quad (8)$$

Here, when difference voltages of a differential input, a differential output and a reference voltage are represented as VIN, VOUT and VR, respectively, their relationships are as follows: VIN+-VIN-=VIN, VOUT+-VOUT-=VOUT, VR+-VR-=VREF. The relationship between the input signal voltage and the output signal voltage of the switched capacitor circuit is expressed as the following equation (9) from equations (7) and (8).

$$VOUT=2*VIN-(1+dC/CSF)*VREF \quad (9)$$

In equation (9), however, it is assumed that relative errors are in the relationship, dCa=dCb=dC.

In the case in which the 1.5-bit DAC 12 generates the reference voltage 0 V, the positive-side voltage VIN+ of a differential input voltage is in the range from VR+/4 to VR-/4, and the switch S5a is coupled to the reference voltage 0 V. The negative-side voltage VIN- is also in the range from VR+/4 to VR-/4, and the switch S5b is coupled to the reference voltage 0 V. Therefore, 0 V is applied across electrodes of the second capacitors CRa and CRb, and theoretically no charge is accumulated. As a result, the foregoing equations (3) and (4) become equations (13) and (14).

$$QSFa=2*CSFa*VIN+ \quad (13)$$

$$QSFb=2*CSFb*VIN- \quad (14)$$

As a result, the foregoing equations (5), (6) and (9) become equations (15), (16), and (19).

$$VOUT+=QSFa/CSFa=2*VIN+ \quad (15)$$

$$VOUT-=QSFa/CSFa=2*VIN- \quad (15)$$

$$VOUT=2*VIN \quad (19)$$

However, there is an error between the common voltage VCOM and the reference voltage 0 V, some charge accumulates in the second capacitors CRa and CRb, and further relative errors are not necessarily dCa=dCb. The above-mentioned equation (19) therefore becomes equation (19a).

$$VOUT=2*VIN-dV \quad (19a)$$

In the case in which the 1.5-bit DAC 12 generates the reference voltages VR- and VR+, the positive-side voltage VIN+ of a differential input voltage is in the range from VR-/4 to VR-, and the switch S5a is coupled to the reference voltage VR-. The negative-side voltage VIN- is in the range from VR+ to VR+/4, and the switch S5b is coupled to the reference voltage VR+. As a result, the foregoing equations (3) and (4) become equations (23) and (24).

$$QSFa=2*CSFa*VIN+-CRa*VR- \quad (23)$$

$$QSFb=2*CSFb*VIN--CRb*VR+ \quad (24)$$

Equation (23) indicates that the second capacitor CRa is charged by applying the reference voltages VR- and 0 V, and, at the node XP, the corresponding charge is removed from the first capacitor CSFa. That is, negative charge at the node XP of the first capacitor CSFa decreases. Likewise, equation (24) indicates that the second capacitor CRb is charged by applying the reference voltages VR+ and 0 V, and, at the node XM, the corresponding charge is removed from the second capacitor CSFb. That is, positive charge at the node XM of the first capacitor CSFb decreases.

As a result, the foregoing equations (5), (6), (7), and (8) become equations (25), (26), (27), and (28).

$$VOUT+=QSFa/CSFa=2*VIN+-CRa/CSFa*VR- \quad (25)$$

$$VOUT-=QSFb/CSFb=2*VIN--CRb/CSFb*VR+ \quad (26)$$

$$VOUT+=QSFa/CSFa=2*VIN+-(1+dCa/CSFa)*VR- \quad (27)$$

$$VOUT-=QSFb/CSFb=2*VIN--(1+dCb/CSFb)*VR+ \quad (28)$$

The foregoing equation (9) becomes equation (29) from the following relationships: VIN+-VIN-=VIN, VOUT+-VOUT-=VOUT, VR+-VR-=VREF.

$$VOUT=2*VIN+(1+dC/CSF)*VREF \quad (29)$$

Figure 9:
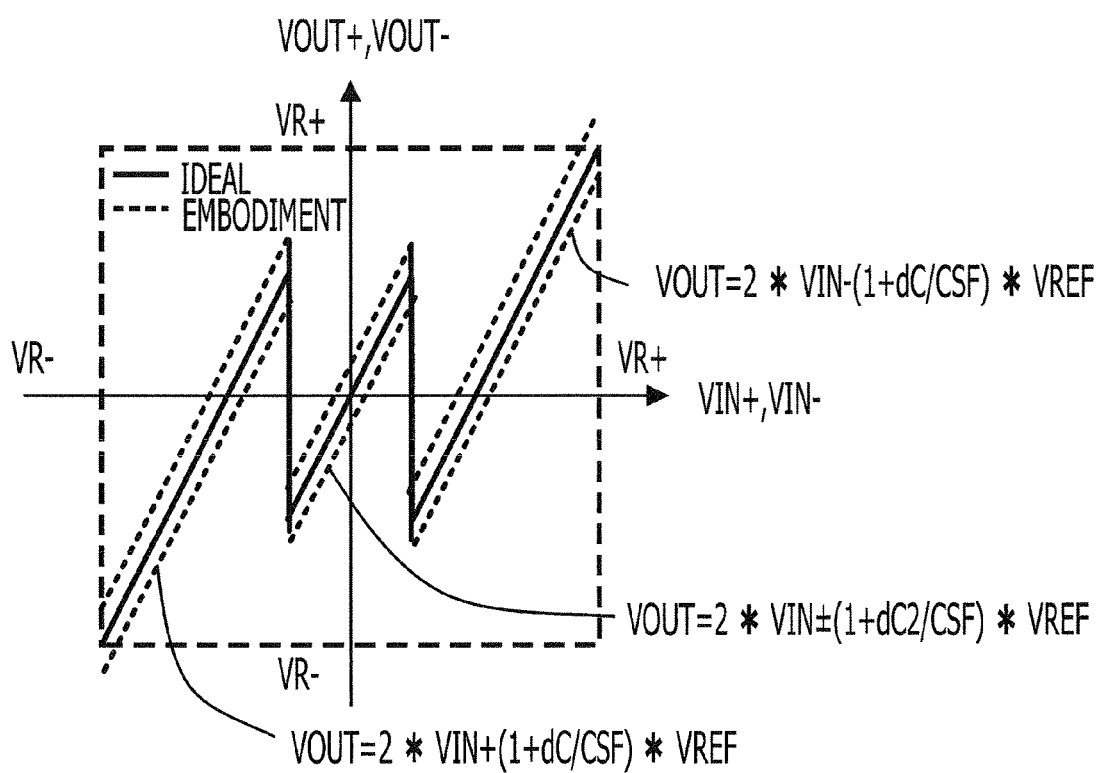
FIG. 9 illustrates input and output characteristics of the switched capacitor circuit in the present embodiment of FIG. 1.

FIG. 9 is a graph of input and output characteristics of a switched capacitor circuit in the present embodiment. In FIG. 9, a solid line indicates an ideal state without the relative error dC in the capacitance between capacitors, and dashed lines indicate cases with the relative error dC in the capacitance. That is, the dashed lines correspond to the foregoing equations (9), (19a), and (29). Depending on the sign of the relative error dC, characteristics indicated by the dashed line on the upper side of the ideal solid line or characteristics indicated by the dashed line on the lower side of the ideal solid line are determined. As illustrated, even though the relative error dC in the capacitance between capacitors exists in input characteristics, coefficients of the input voltages VIN in equations (9), (19a), and (29) include no relative error dC. The gradient of the input and output characteristics matches that of the ideal circuit, and the relative error affects an offset component.

In the case of unit conversion circuits coupled in multiple stages as illustrated in FIG. 1, an offset value caused by the relative error is added to a differential output voltage to be transferred to the subsequent stage. This improves the accuracy of the ADC.

Figure 10:
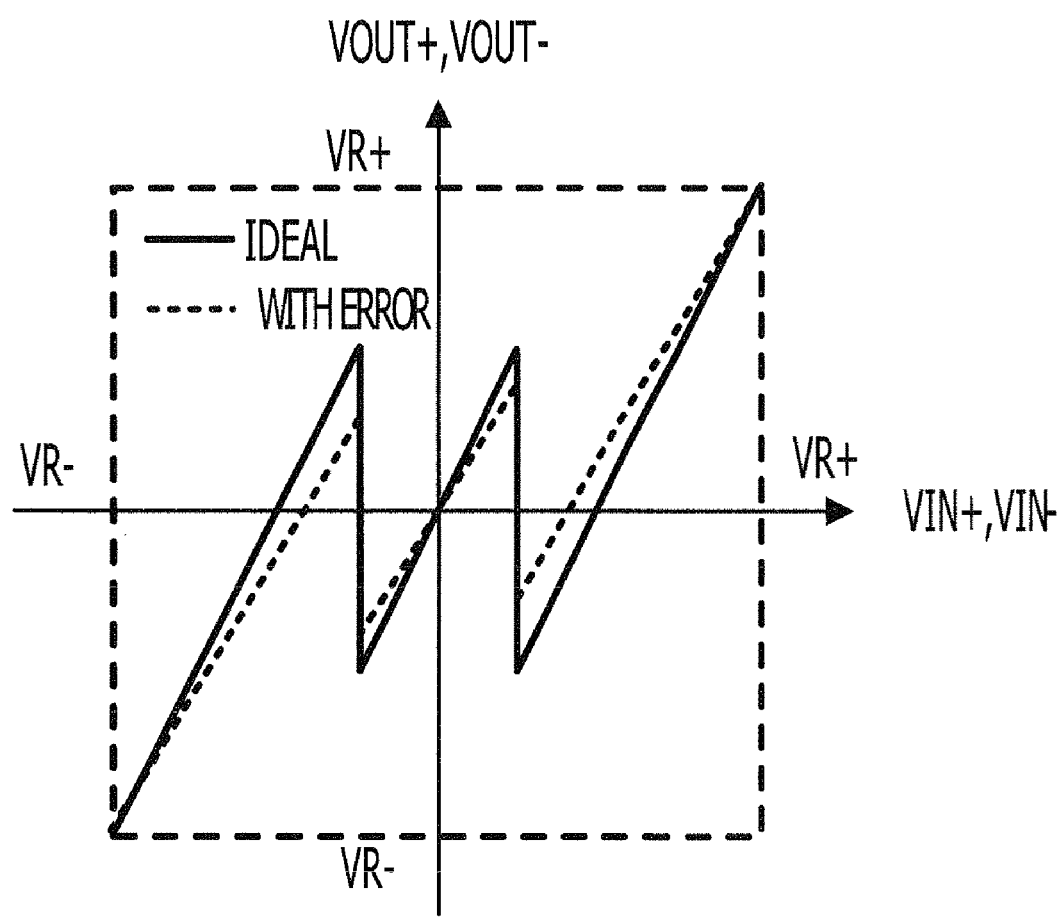
FIG. 10 illustrates input and output characteristics in the case with the relative error in the capacitance between capacitors of another switched capacitor circuit.

FIG. 10 is a graph of input and output characteristics in the case with the relative error in the capacitance between capacitors in another switched capacitor circuit. A dashed line indicates input and output characteristics in the case with the relative error. In this case, when the coefficients of VIN of the foregoing equations (9), (19a), and (29) include the relative errors, the gradient of the input and output characteristics does not match that of the ideal circuit. This greatly decreases the accuracy of a differential output voltage to be transferred to the subsequent stage. The present embodiment produces an improvement in this respect.

Figure 11:
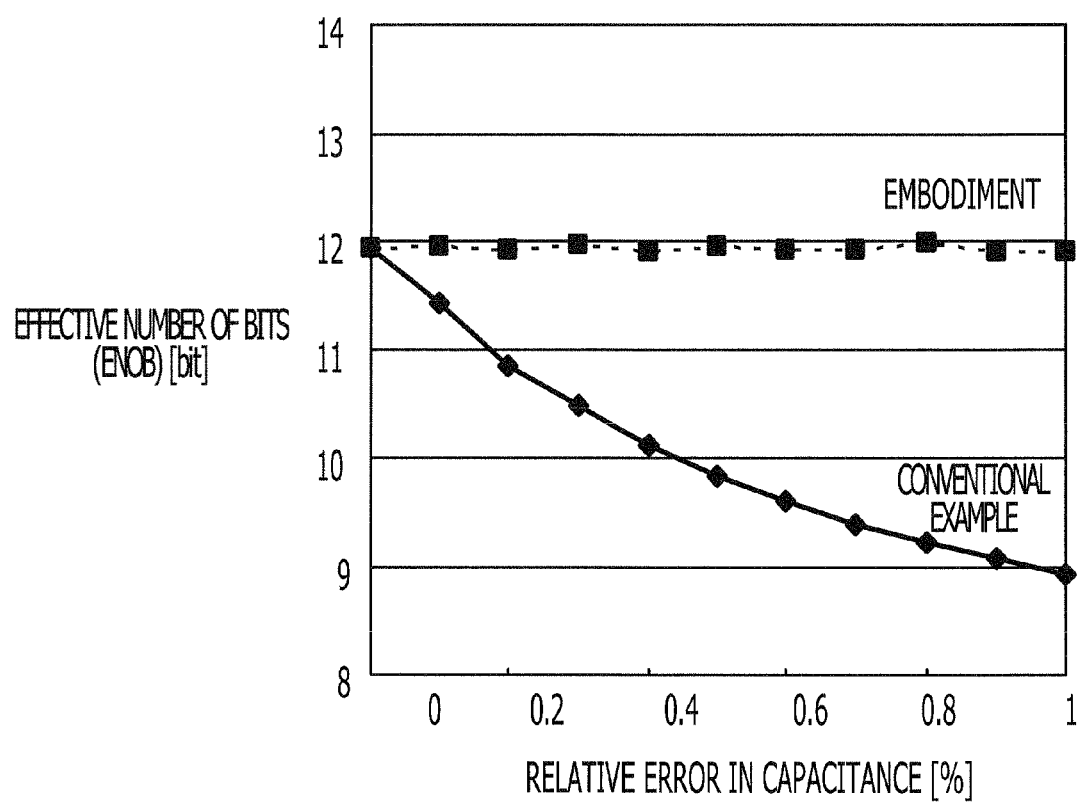
FIG. 11 illustrates the effective number of bits with respect to the relative error in the capacitance of capacitors in an operation model of a 12-bit pipelined ADC.

FIG. 11 is a graph illustrating the effective number of bits (ENOB) with respect to the relative error in the capacitance of capacitors in an operation model of a 12-bit pipelined ADC. In the case of another example that has the relative error, as illustrated in FIG. 10, the SNOB greatly decreases as the relative error in the capacitance increases. However, in the case of the present embodiment, the SNOB is close to approximately 12 bits. That is, in the present embodiment, the accuracy of ADC improves.

Figure 12:
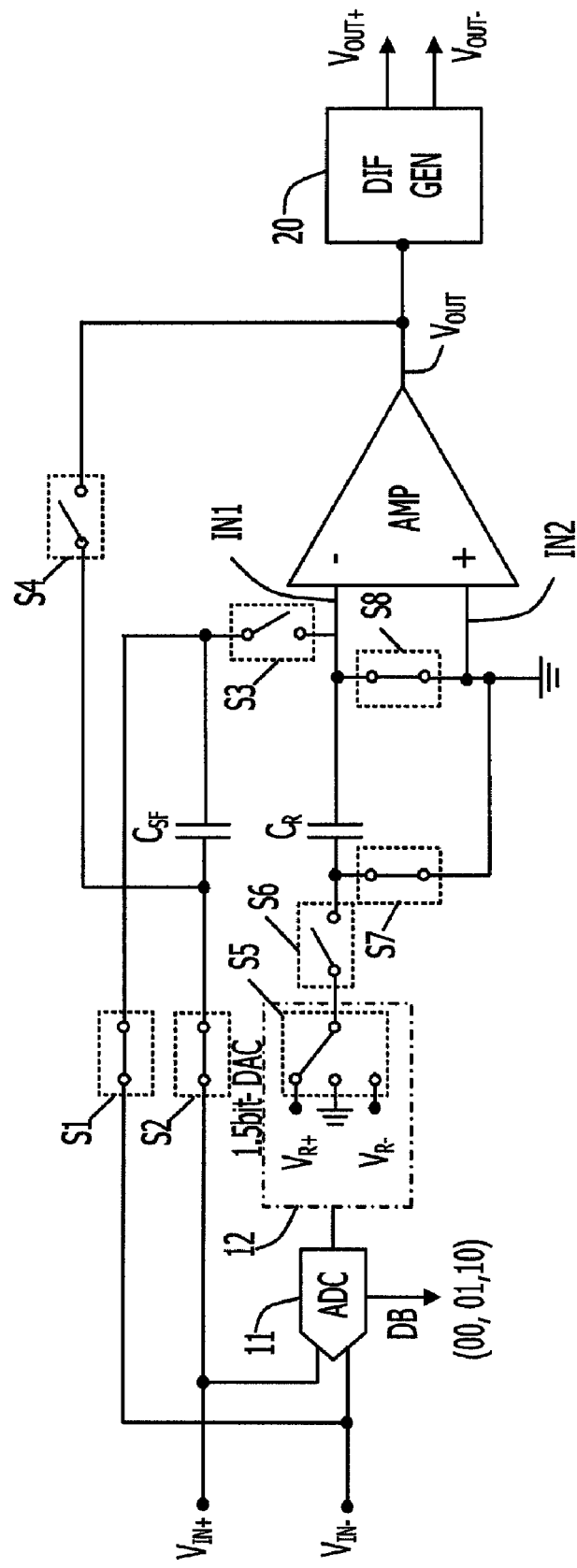
FIG. 12 illustrates a first coupling state of a unit conversion circuit in a second embodiment.
Figure 13:
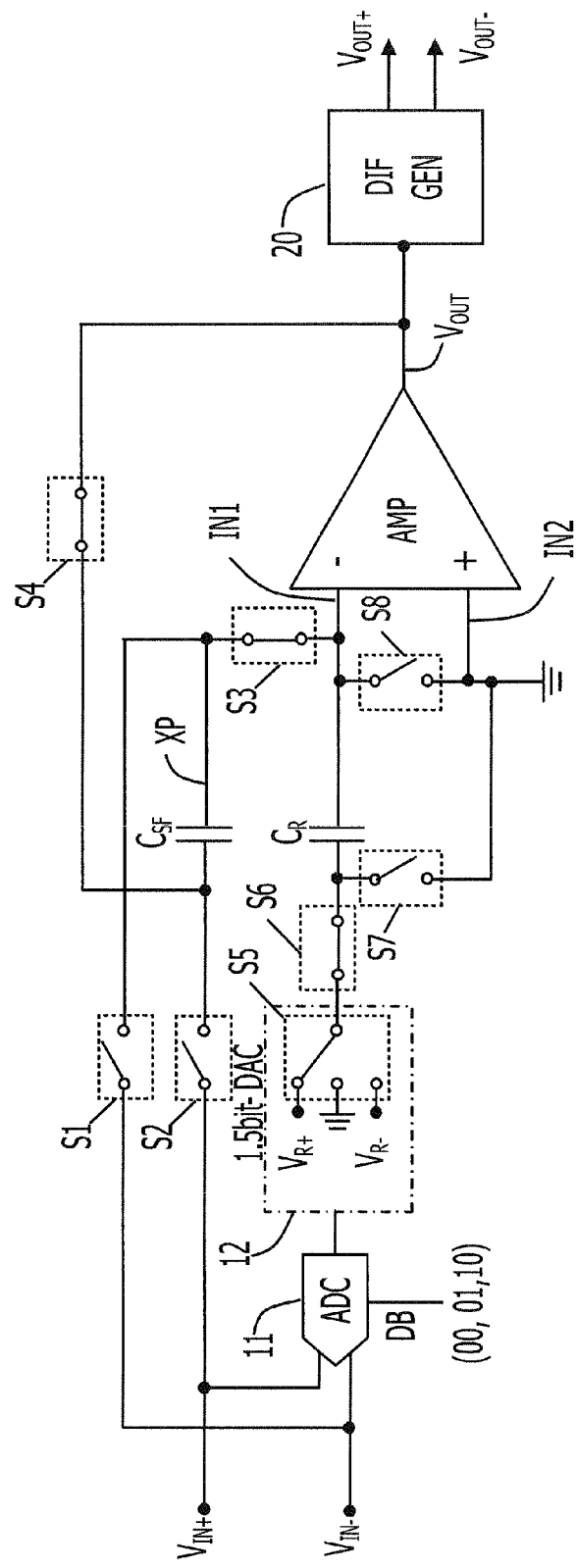
FIG. 13 illustrates a second coupling state of the unit conversion circuit in the second embodiment.

FIGS. 12 and 13 are circuit diagrams of a unit conversion circuit in the second embodiment. The switched capacitor circuit in the unit conversion circuit of FIGS. 5 and 7 is of a fully differential type, whereas a single-end switched capacitor circuit is used in an example of FIGS. 12 and 13. FIG. 12 illustrates a state of the first period, and FIG. 13 illustrates a state of the second period.

The single-end switched capacitor circuit includes an operational amplifier AMP that has two inputs, a first capacitor CSF to which a difference voltage of differential input voltages IN+ and IN− is applied in the first period and which is coupled between the input and output of the operational amplifier in the second period, and a second capacitor CR which is coupled between one of the reference voltages VR+, 0 V, and VR− and the first capacitor CSF in the second period. Further, a group of switches S1 to S8 is included. A second input IN2 of the operational amplifier AMP may always be coupled to ground 0 V as a reference voltage. The operational amplifier AMP outputs an output signal VOUT. Two capacitors CSF and CR are designed to have a similar capacitance; however, they have capacitances which are equal in the range including the relative error dC caused by manufacturing variations. Changes in the first period and the second period are similar to those in FIG. 4.

In the first period, the group of switches enters the state illustrated in FIG. 12. The switches S1, S2, S7 and S8 are turned on, and the other switches S3, S4 and S6 are turned off. In this state, positive and negative analog differential input voltages VIN+ and VIN− are applied to electrodes of the capacitor CSF. The charge amount QSF accumulated in the capacitor CSF, as a result of this, is expressed by the following equation (31).

$$QSF=CSF*(VIN+-VIN-)=2*CSF*VIN+ \quad (31)$$

However, VIN+ and VIN− represent the positive value and the negative value of a differential input voltage, respectively, and therefore the following is given:

$$VIN+-VIN-=2*VIN+, VIN--VIN+=2*VIN-.$$

In the first period, the 1.5-bit ADC 11 in the stage performs ADC from the analog differential input voltage to the digital signal DB.

In the second period, the group of switches enters the state illustrated in FIG. 13, and the switches S3, S4 and S6 are turned on and the switches S1, S2, S7 and S8 are turned off. On the basis of the output digital code DB of the 1.5-bit ADC 11, the destination of coupling of the switch S5 of a 1.5-bit DAC is determined in order to select one of the reference voltages VR+, 0 V, and VR−. This selection is similar to in the example illustrated in FIG. 7. In an example at this point, the reference voltage VR+ is selected.

The capacitor CSF is coupled between the input node IN1 and the output node VOUT of the operational amplifier AMP. The charge amount QSF accumulated in the capacitor CSF at this point is expressed as the following equation (33) from the law of conservation of charge at the node XP.

$$QSF=2*CSF*VIN+-CR*VR+ \quad (33)$$

In other words, from equation (33), the output signal voltage VOUT of the switched capacitor circuit is expressed by equation (35).

$$VOUT=QSF/CSF=2*VIN+-CR/CSF*VR+ \quad (35)$$

The capacitors CSF and CR are both designed to have the similar capacitance; however, the relative error dC caused by manufacturing variations is actually included. When the relative error in the capacitance between CR and CSF, which is represented as dC, is substituted in equation (35), the output signal voltage VOUT is expressed by equation (39).

$$VOUT=QSF/CSF=2*VIN+-(1+dC/CSF)*VR+ \quad (39)$$

Accordingly, it is shown that equation (39) expressing the input and output characteristics of the switched capacitor circuit in the second embodiment is equivalent to equation (9) expressing the input and output characteristics of the switched capacitor circuit in the foregoing embodiment. Therefore, in the switched capacitor circuit of the second embodiment, it is possible to reduce the effect of the relative error in the capacitance in the pipelined ADC, as in the switched capacitor circuit of the foregoing embodiment.

Further, in the case where the 1.5-bit DAC 12 selects the reference voltage 0 V, VOUT=QSF/CSF=2*VIN+, and in the case of selecting the reference voltage VR−, VOUT=QSF/CSF=2*VIN++CR/CSF*VR−. These equations are equivalent to equations (19) and (29) in the foregoing embodiment.

The output voltage VOUT of the operational amplifier AMP is not a differential voltage. Therefore, as illustrated in FIGS. 12 and 13, a differential voltage generating circuit 20 is preferably provided which generates output differential voltages VOUT+ and VOUT− centered at a common voltage VCOM=0V on the basis of the amplitude from ground 0 V of the output voltage VOUT. This enables the circuit to be used as a unit conversion circuit at every stage of the pipelined ADC illustrated in FIG. 1.

If the differential voltage generating circuit 20 is not provided, the unit conversion circuit of FIGS. 12 and 13 may be applied to, for example, the unit conversion circuit at the first stage of the pipelined ADC of FIG. 1. Even in this case, the accuracy of conversion of the MSB increases to improve the accuracy of ADC.

As described above, according to the present embodiment, the differential input voltages VIN+ and VIN− are applied across both terminals of the first capacitor for sampling in the first period or a sample period, and a reference voltage is applied to the second capacitor in the second period or a hold period. Thus, it is possible to improve the accuracy of the converted output voltage VOUT.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the aspects of the invention and the concepts contributed by the inventor to furthering the art, and are to be construed as being without limitation to such specifically recited examples and conditions, nor does the organization of such examples in the specification relate to a illustrating of the superiority and inferiority of the aspects of the invention. Although the embodiments in accordance with aspects of the present invention have been described in detail, it should be understood that various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A conversion circuit for converting a differential input signal into an output signal, the conversion circuit comprising:
   an amplifier that has an input terminal and an output terminal;
   a first capacitor in which, in a first period, a difference voltage of the differential input signal is applied across first and second terminals, and in a second period, the first terminal is coupled to the output terminal of the amplifier and the second terminal is coupled to the input terminal of the amplifier; and
   a second capacitor in which, in the second period, a reference voltage in accordance with the differential input signal is applied to a first terminal, and the second terminal of the first capacitor is coupled to a second terminal.

2. The conversion circuit according to claim 1, further comprising:
   a sub analog-to-digital converter which determines whether the difference voltage of the differential input signal is larger than a criterion differential voltage, or equal to or less than the criterion differential voltage so as to generate a sub-digital output; and
   a sub digital-to-analog converter which generates the reference voltage in accordance with the sub-digital output of the sub analog-to-digital converter,
   wherein, in the second period, the reference voltage generated by the sub digital-to-analog converter is applied to the first terminal of the second capacitor, so that the sub-digital output generated by the sub analog-to-digital converter is output.

3. The conversion circuit according to claim 1,
   wherein, in the first period, the first and second terminals of the second capacitor are short-circuited to a common voltage, and the input terminal of the amplifier is coupled to the common voltage.

4. The conversion circuit according to claim 1,
   wherein the first capacitor and the second capacitor have a similar capacitance with a manufacturing variation.

5. A conversion circuit for converting a differential input signal into a differential output signal, the conversion circuit comprising:
   an amplifier that has first and second input terminals and first and second output terminals;
   a first capacitor in which, in a first period, a difference voltage of the differential input signal is applied across first and second terminals, and in a second period, the first terminal is coupled to the first output terminal of the amplifier and the second terminal is coupled to the first input terminal of the amplifier;
   a second capacitor in which, in the first period, the difference voltage of the differential input signal is applied across first and second terminals, and in the second period, the first terminal is coupled to the second output terminal of the amplifier and the second terminal is coupled to the second input terminal of the amplifier;
   a third capacitor in which, in the second period, a positive-side reference voltage in accordance with the differential input signal is applied to a first terminal, and the second terminal of the first capacitor is coupled to a second terminal; and
   a fourth capacitor in which, in the second period, a negative-side reference voltage in accordance with the differential input signal is applied to a first terminal, and the second terminal of the second capacitor is coupled to a second terminal.

6. The conversion circuit according to claim 5, further comprising:
   an analog-to-digital converter which determines whether the difference voltage of the differential input signal is larger than a criterion differential voltage or equal to or less than the criterion differential voltage so as to generate a digital output; and
   a digital-to-analog converter which generates the positive-side and negative-side reference voltages in accordance with the digital output of the analog-to-digital converter,
   wherein, in the second period, the positive-side reference voltage generated by the digital-to-analog converter is applied to the first terminal of the third capacitor, and the negative-side reference voltage is applied to the first terminal of the fourth capacitor, so that the digital output generated by the analog-to-digital converter is output.

7. The conversion circuit according to claim 5,
   wherein, in the first period, the first and second terminals of the third capacitor are short-circuited to a common voltage, the first input terminal of the amplifier is coupled to the common voltage, the first and second terminals of the fourth capacitor are short-circuited to the common voltage, and the second input terminal of the amplifier is coupled to the common voltage.

8. The conversion circuit according to claim 5,
wherein the first capacitor and the third capacitor have a similar capacitance with a manufacturing variation, and the second capacitor and the fourth capacitor have a similar capacitance with a manufacturing variation.

9. An analog-to-digital converter comprising:
a plurality of conversion circuits, associated with first to nth (n being an integer of 2 or more) stages, for converting a differential input signal into an output signal; and
an encoder to which a 1.5-bit digital output generated by each of the plurality of conversion circuits associated with the first to nth stages is input and which generates a digital output,
wherein an output signal of a conversion circuit at an mth (m being 1 or more and being n−1 or less) stage is supplied as a differential input signal of a conversion circuit at an m+1 stage,
wherein each of the plurality of conversion circuits comprises:
an amplifier that has an input terminal and an output terminal;
a first capacitor in which, in a first period, a difference voltage of the differential input signal is applied across first and second terminals, and in a second period, the first terminal is coupled to the output terminal of the amplifier and the second terminal is coupled to the input terminal of the amplifier; a second capacitor in which, in the second period, a reference voltage in accordance with the differential input signal is applied to a first terminal, and the second terminal of the first capacitor is coupled to a second terminal;
a sub analog-to-digital converter which determines whether the difference voltage of the differential input signal is larger than a criterion differential voltage, or equal to or less than the criterion differential voltage so as to generate a digital output; and
a sub digital-to-analog converter which generates the reference voltage in accordance with the digital output of the sub analog-to-digital converter,
wherein, in the second period, the reference voltage generated by the sub digital-to-analog converter is applied to the first terminal of the second capacitor, so that the digital output generated by the sub analog-to-digital converter is output.

10. The analog-to-digital converter according to claim 9,
wherein, among the plurality of conversion circuits associated with the first to nth stages, when conversion circuits at odd-numbered stages are controlled to be in a state of the first period, conversion circuits at even-numbered stages are controlled to be in a state of the second period, and then, when the conversion circuits at the odd-numbered stages are controlled to be in the state of the second period, the conversion circuits at the even-numbered stages are controlled to be in the state of the first period, the conversion circuits at the odd-numbered stages and the conversion circuits at the even-numbered stages being alternately controlled to be in the state of the first period and the state of the second period.

* * * * *